(12) United States Patent
Lin et al.

(10) Patent No.: US 8,692,359 B2
(45) Date of Patent: Apr. 8, 2014

(54) THROUGH SILICON VIA STRUCTURE HAVING PROTECTION RING

(75) Inventors: Yung-Chang Lin, Taichung (TW); Chien-Li Kuo, Hsinchu (TW); Ming-Tse Lin, Hsinchu (TW); Sun-Chieh Chien, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/309,559

(22) Filed: Dec. 2, 2011

(65) Prior Publication Data

US 2013/0140708 A1    Jun. 6, 2013

(51) Int. Cl.
*H01L 29/40* (2006.01)

(52) U.S. Cl.
USPC ............................................ 257/621; 257/774

(58) Field of Classification Search
USPC .................. 257/661, 678, 688, 774, E21.506, 257/E23.011, E23.114, E23.002, 621, 6, 257/724; 438/653

See application file for complete search history.

(56) References Cited

U.S. PATENT DOCUMENTS

| | | | |
|---|---|---|---|
| 6,492,716 B1* | 12/2002 | Bothra et al. | 257/678 |
| 2006/0154465 A1* | 7/2006 | Suh et al. | 438/597 |
| 2010/0224965 A1* | 9/2010 | Kuo | 257/621 |

* cited by examiner

*Primary Examiner* — Yu-Hsi D Sun
*Assistant Examiner* — Christina Sylvia
(74) *Attorney, Agent, or Firm* — Winston Hsu; Scott Margo

(57) ABSTRACT

A method of fabricating a semiconductor device includes the following steps. A semiconductor substrate having a first side and a second side facing to the first side is provided. At least an opening is disposed in the semiconductor substrate of a protection region defined in the first side. A first material layer is formed on the first side and the second side, and the first material layer partially fills the opening. Subsequently, a part of the first material layer on the first side and outside the protection region is removed. A second material layer is formed on the first side and the second side, and the second material layer fills the opening. Then, a part of the second material layer on the first side and outside the protection region is removed. Finally, the remaining first material layer and the remaining second material layer on the first side are planarized.

8 Claims, 5 Drawing Sheets

THROUGH SILICON VIA STRUCTURE HAVING PROTECTION RING

BACKGROUND OF THE INVENTION

1. Field of the Invention

The present invention relates to a semiconductor device and a method of fabricating the same, and more particularly, to a semiconductor device including a protection ring and a method of fabricating the protection ring.

2. Description of the Prior Art

With the trend of miniaturization, diversification and always higher performances of the portable electronic products and peripherals, three-dimensional (3D) interconnects technique has become one of the important developing aspects of the current package technology in order to achieve thin structure and high integration of the semiconductor devices. The 3D interconnects technique can be used to improve the abilities and the capacities of a semiconductor packaged element.

The through silicon via (TSV) technique, which aims at solving the problems of interconnection between the wafers, is a 3D interconnects technique. With the TSV technique holes are drilled in the wafer by etching or by laser means, the holes are then filled with conductive materials, such as copper, polysilicon or tungsten, to form vias, i.e. conductive channels connecting inner regions and outer regions. Finally, the wafers or the dice are thinned to be stacked and bonded, which then become three-dimensional stack integrated circuits (3D stack IC). The package size of the 3D stack IC is of the size of the dice, in order to meet the requirements of miniaturization.

TSV technique, as opposed to the conventional stack package of wire bonding type, stacks the wafers or the dices vertically to reduce the length of the conductive lines, which means that the inner connection distances can be shortened. Therefore 3D stack ICs perform better in many ways, like faster transmission and lower noise, especially for applications in CPU, flash memories and memory cards. Additionally, TSV technique can also be employed for heterogeneous integration of different ICs, like stacking a memory on a CPU for example.

The TSV technique processes for semiconductors can be divided into two types, namely via first or via last, in accordance with the order of the formation of the vias. For the via first process, the vias produced with the TSV technique are formed before the back end of the line (BEOL) process. Conversely, for the via last process, the vias produced with TSV technique are formed after BEOL process.

In addition, protection rings may provide insulating effect when disposed between the vias in the package region and the transistors in the active area region. During the formation of the protection rings, during the step of filling the protection ring with insulating material, the accumulated thickness of the insulating material layer may increase the stress imposed on the semiconductor substrate, and may accordingly induce damages in the semiconductor substrate. Consequently, how to improve the protection ring process in order to prevent abnormal performances of semiconductor devices caused by damages of semiconductor substrate is an important issue in this field.

SUMMARY OF THE INVENTION

It is therefore one of the objectives of the present invention to provide a method of fabricating a semiconductor device including a protection ring and improve the semiconductor device performance.

An exemplary embodiment of the present invention provides a method of fabricating a semiconductor device that includes the following steps. A semiconductor substrate is provided, the semiconductor substrate has a first side and a second side opposite to the first side. A protection region is defined on the first side, and at least an opening is performed in the protection region of the semiconductor substrate. A first material layer is formed on the first side and on the second side, with the first material layer partially filling the opening. Subsequently, a part of the first material layer on the first side and outside the protection region is removed. A second material layer is formed on the first side and on the second side, with the second material layer filling the opening. Then, a part of the second material layer on the first side and outside the protection region is removed. Finally, the remaining first material layer and second material layer on the first side are planarized.

Another exemplary embodiment of the present invention provides a semiconductor device. The semiconductor device includes a semiconductor substrate, a protection ring and at least a through silicon via (TSV). The protection ring disposed in the semiconductor substrate comprises a pad oxide layer, a nitride layer, a first material layer and a second material layer, and a stress of the first material layer and a stress of the second material layer are different. The through silicon via is disposed in the semiconductor substrate, wherein the protection ring surrounds the through silicon via, and the protection ring does not contact the through silicon via.

The present invention provides a multi-steps process for respectively forming the first material layer and the second material layer to fill the opening with, in which a thickness of the first material layer is substantially smaller than or equal to one fourth of a width of the opening, or a thickness of the second material layer is substantially smaller than or equal to one fourth of a width of the opening. The present invention reduces the accumulated thickness of the material layer formed in one step. Hence, the reliability of the semiconductor device performance is improved by avoiding defects in the semiconductor substrate caused by stresses induced by formed material layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
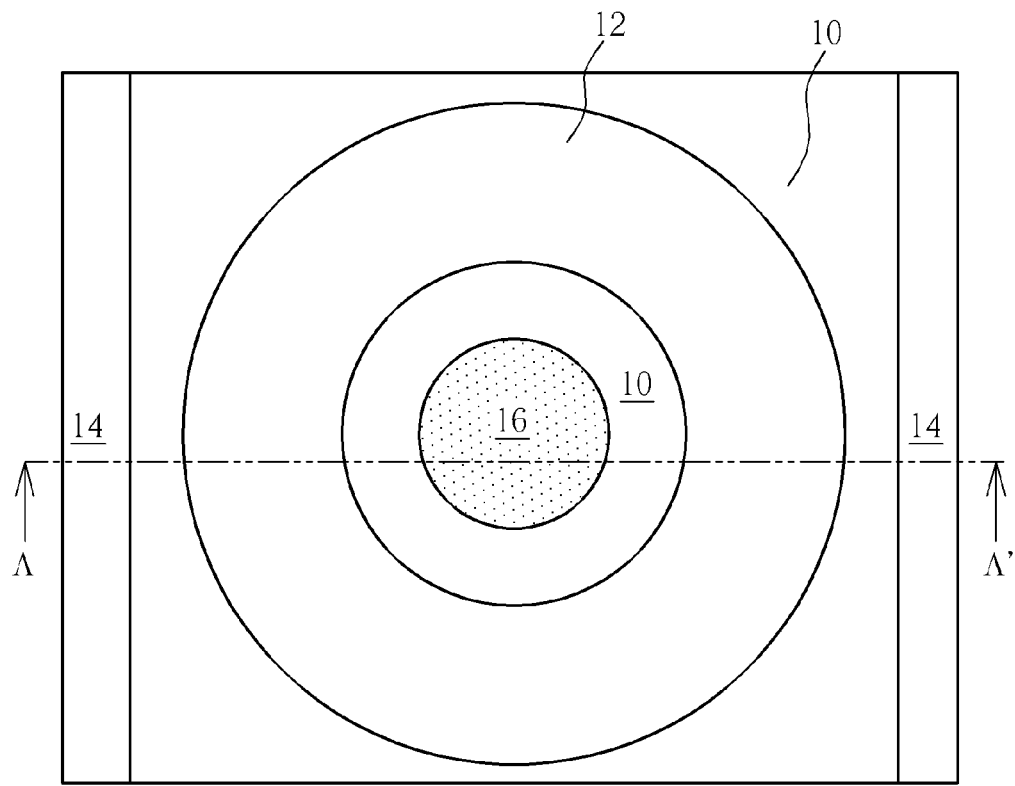
FIG. 1 is a schematic diagram illustrating a semiconductor device according to a preferred exemplary embodiment of the present invention.
Figure 2:
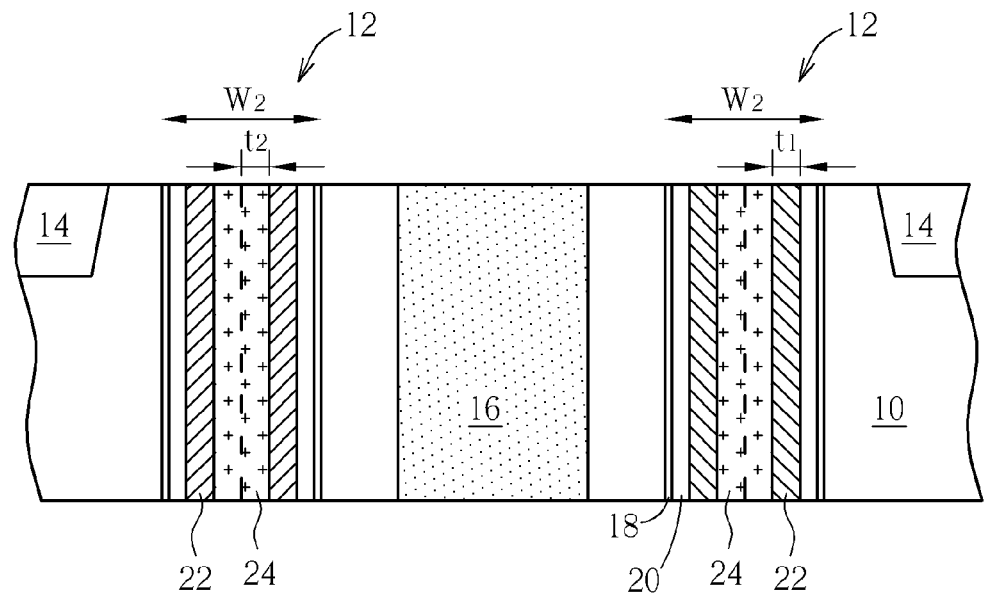
FIG. 2 is a cross-sectional view illustrating the semiconductor device taken along the line AA' of FIG. 1 according to a preferred exemplary embodiment of the present invention.

The present invention provides a semiconductor device, please refer to FIG. 1 and FIG. 2. FIG. 1 is a schematic diagram illustrating a semiconductor device according to a preferred exemplary embodiment of the present invention. FIG. 2 is a cross-sectional view illustrating a semiconductor device taken along the line AA' of FIG. 1 according to a preferred exemplary embodiment of the present invention. As shown in FIG. 1 and FIG. 2, the semiconductor device includes a semiconductor substrate 10, a protection ring 12, a shallow trench isolation (STI) 14 and at least a through silicon via (TSV) 16. The semiconductor substrate 10 may be a substrate composed of AsGa, silicon on insulator (SOI) layer, epitaxial layer, SiGe layer or other semiconductor materials. The protection ring 12 is disposed in the semiconductor substrate 10, and the protection ring 12 includes a pad oxide layer 18, a nitride layer 20, a first material layer 22 and a second material layer 24. A material of the pad oxide layer 18 includes silicon oxide, and the pad oxide layer 18 may serve as a barrier layer between the nitride layer 20 and the semiconductor substrate 10 to avoid the distortion of the semiconductor substrate 10. The first material layer 22 and the second material layer 24 may include insulating material such as silicon oxide. The shallow trench isolation 14 is disposed in the semiconductor substrate 10. A depth of the shallow trench isolation 14 is substantially smaller than a depth of the protection ring 12, and an aspect ratio of the protection ring 12 is substantially larger than an aspect ratio of the shallow trench isolation 14. The through silicon via 16 is disposed in the semiconductor substrate 10, where the protection ring 12 surrounds, but does not contact the through silicon via 16. The protection ring 12 provides insulating effect for the through silicon via 16. More specifically, the protection ring 12 is disposed in the semiconductor substrate 10 between the through silicon via 16 and the shallow trench isolation 14.

It is appreciated that, as the material of the first material layer 22 and the material of the second material layer 24 are the same, a thickness t1 of the first material layer 22 could be substantially smaller than or equal to one fourth of a width w2 of the protection ring 12, and the thickness t1 of the first material layer 22 is preferably substantially equal to one fourth of the width w2 of the protection ring 12. The first material layer 22 partially fills the protection ring 12, and after the disposition of the second material layer 24, a sum of the thickness t1 of the first material layer 22 and a thickness t2 of the second material layer 24 may be substantially larger than or equal to half of the width w2 of the protection ring 12. This way, the protection ring 12 can be filled with the first material layer 22 and the second material layer 24. The present invention uses a multi-steps process for respectively forming the first material layer 22 and the second material layer 24, instead of a one step process for forming the single material layer to fill the protection ring 12 with. The illustrated single material layer has a thickness substantially larger than the thickness t1 of the first material layer 22 or the thickness t2 of the second material layer 24; that is, the multi steps deposition of the first material layer 22 and the second material layer 24 may avoid excessive stresses which are applied to the semiconductor substrate 10 and caused by the thickness of the material layers, and defects such as cracks in the semiconductor substrate 10 can be prevented. Similarly, in another exemplary embodiment, the thickness t2 of the second material layer 24 could be substantially smaller than or equal to one fourth of a width w2 of the protection ring 12, and the thickness t2 of the second material layer 24 is preferably substantially equal to one fourth of a width w2 of the protection ring 12. After the disposition of the second material layer 24 on the first material layer 22, a sum of the thickness t1 of the first material layer 22 and a thickness t2 of the second material layer 24 may be substantially larger than or equal to half of the width w2 of the protection ring 12.

As the material of the first material layer 22 is different from the material of the second material layer 24, the thickness may be adjusted according to the stress. For instance, as the first material layer 22 has the thickness t1 and provides a stress f1 applied to the semiconductor substrate 10, and the second material layer 24 has the thickness t2 and provides a stress f2 applied to the semiconductor substrate 10, it is preferable that $t1*f1=t2*f2$.

In addition, the multi-steps process for forming the first material layer 22 and the second material layer 24 is not limited to two-step process. The number of steps could be adjusted according to the width w2 of the protection ring 12, the thickness of the material layers and the stress of the material layers. For instance, in order to fill the protection ring having the wider width, the thickness of the first material layer may get larger, accordingly, the product of the thickness and the stress may get larger as well. Therefore, the process for forming the material layers may be performed in three steps or more steps to disperse the stresses between the material layers and the semiconductor substrate 10.

Figure 3:
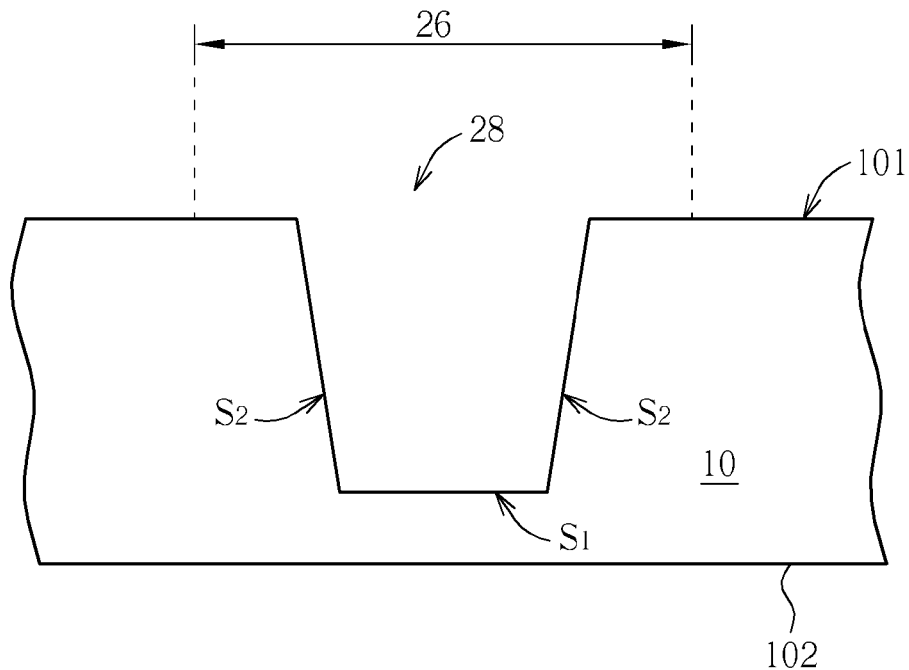
FIG. 3 through FIG. 10 illustrate a method of fabricating a semiconductor device according to a preferred exemplary embodiment of the present invention.

The present invention also provides a method of fabricating a semiconductor device, and more specifically, a method of fabricating a protection ring disposed around the through silicon via. Please refer to FIG. 3 through FIG. 10. FIG. 3 through FIG. 10 illustrate a method of fabricating a semiconductor device according to a preferred exemplary embodiment of the present invention. As shown in FIG. 3, a semiconductor substrate 10 is provided, and the semiconductor substrate 10 has a first side 101 and a second side 102 opposite to the first side 101. A protection region 26 is defined in the first side 101, and at least an opening 28 is performed in the protection region 26 of the semiconductor substrate 10. The method of forming the opening 28 includes the following steps. A silicon oxide layer (not shown) is formed on the semiconductor substrate 10, with the silicon oxide layer having a thickness about 25 angstrom (Å) for example, that could be used to protect the semiconductor substrate 10. Subsequently, a patterned photoresist layer (not shown) is formed on the silicon oxide layer, and the patterned photoresist layer may further serve as a mask for an etching process. This etching process removes a part of the silicon oxide layer and a part of the semiconductor substrate 10 to define the location of the opening 28. Afterwards, the patterned photoresist layer is removed. The formed opening 28 has a width of substantially a few of micrometers (μm) such as 2.3 μm, and a depth substantially between 50 μm and 60 μm, such as 52 μm for example. The method of forming the opening 28 and the size of the opening 28 are not limited thereto.

Figure 4:
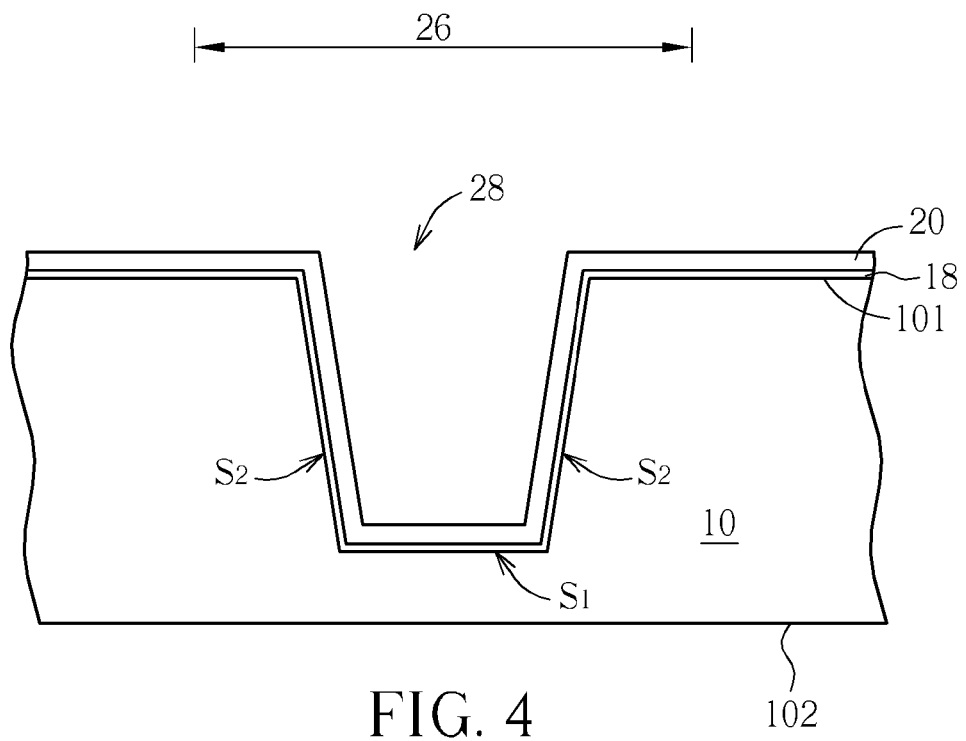

As shown in FIG. 4, a pad oxide layer 18 and a nitride layer 20 are deposited all over the semiconductor substrate 10. The pad oxide layer 18 and the nitride layer 20 cover the surfaces of the opening 28, that is, the bottom surface S1 and the lateral surfaces S2 of the opening 28, and the pad oxide layer 18 is disposed between the semiconductor substrate 10 and the nitride layer 20. The pad oxide layer 18 could be a silicon oxide layer having a thickness of substantially 90 Å, and the nitride layer 20 could be a silicon nitride layer having a thickness of substantially 500 Å. The pad oxide layer 18 may be a barrier layer between the nitride layer 20 and the semiconductor substrate 10 and can improve the adhesiveness of the nitride layer 20. Furthermore, the nitride layer 20 may serve as an etching stop layer for the following etching process.

Figure 5:
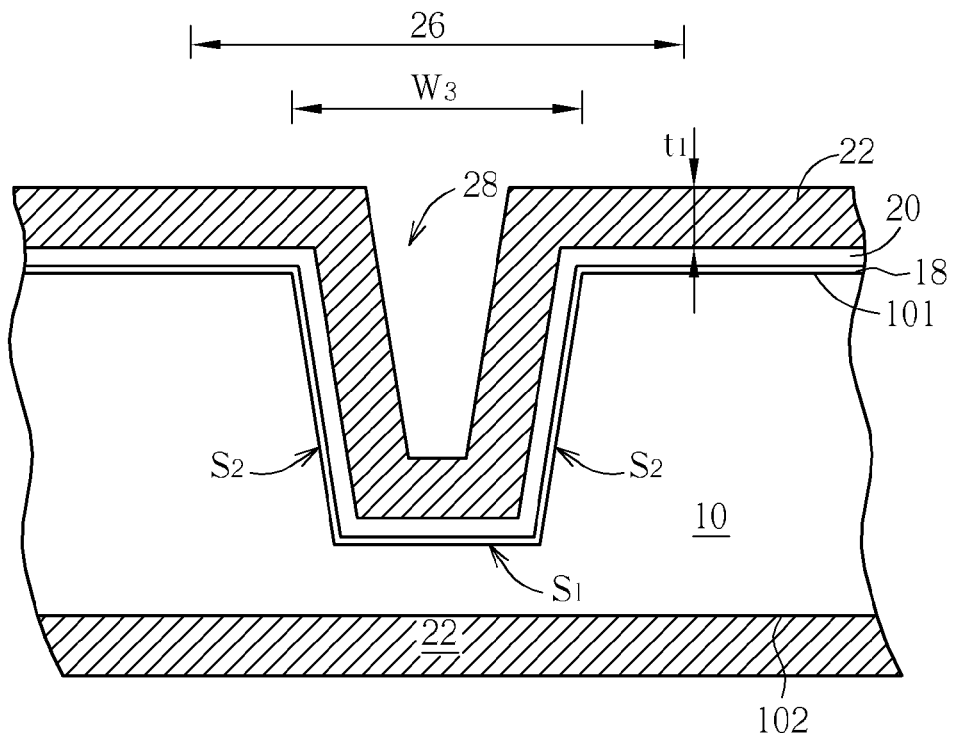

As shown in FIG. 5, the first material layer 22 is deposited on the first side 101 and the second side 102 of the semiconductor substrate 10. The first material layer 22 may include insulating material, such as silicon oxide formed through a chemical vapor deposition (CVD) process, with gas source such as TEOS, or non-doped silicate glass (NSG). In this exemplary embodiment, the first material layer 22 disposed on the nitride layer 20 covers the bottom surface S1 and the lateral surfaces S2 of the opening 28. A thickness t1 of the first material layer 22 could be substantially smaller than or equal to one fourth of a width w3 of the opening 28, and the thickness t1 of the first material layer 22 is preferably substantially equal to one fourth of the width w3 of the opening 28. In other words, the first material layer 22 partially fills the opening 28. During the deposition process for forming the first material layer 22, as the thickness of the first material layer 22 disposed on the two corresponding surfaces increases, including the first side 101 and the second side 102, namely the front side and the back side of the semiconductor substrate 10, the stress uniformity of the first material layer 22 gets larger.

Figure 6:
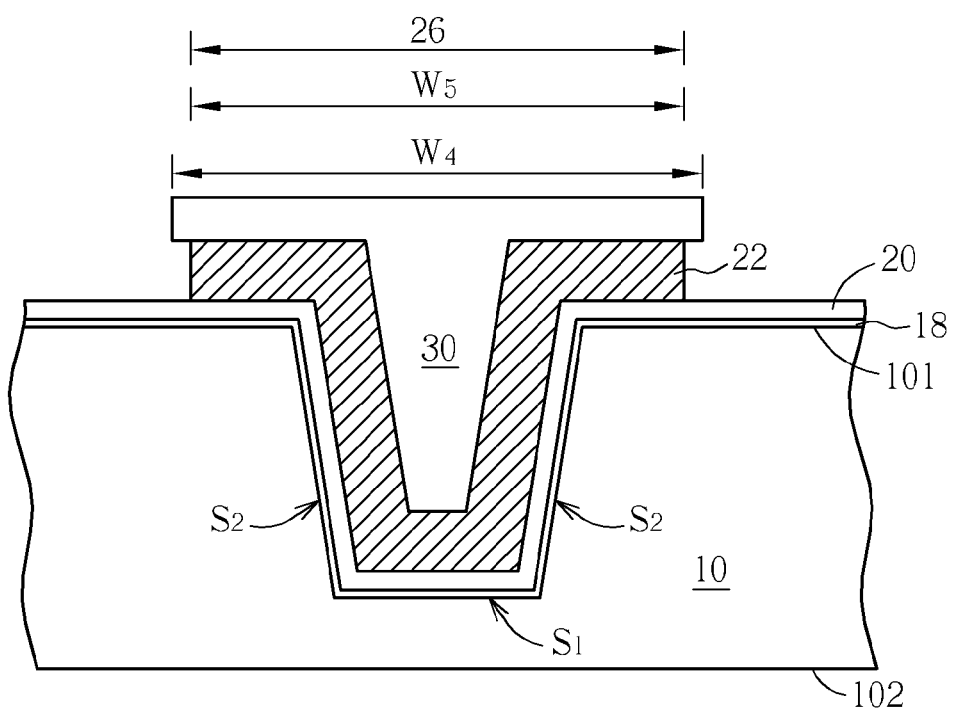

Accordingly, the present invention first reduces the thickness of the material layer formed in a single step, in order to avoid the stresses during the deposition process, which could cause defects within the semiconductor substrate 10. Subsequently, as shown in FIG. 6, a patterned photoresist layer 30 is formed on the first material layer 22. The patterned photoresist layer 30 can cover the top of the opening 28, and a width w4 of the patterned photoresist layer 30 is substantially larger than a width w5 of the protection region 26. To avoid an excessive accumulated thickness on the front side and the back side of the semiconductor substrate 10, a part of the first material layer 22 on the first side 101 and outside the protection region 26, and all the first material layer 22 on the second side 102 are removed before forming the second material layer (not shown). A unique etching process is preferably performed to simultaneously remove a part of the first material layer 22 on the first side 101 and outside the protection region 26 and all the first material layer 22 on the second side 102. The etching process may be a wet etching process, and the etchant preferably has selectivity properties towards silicon oxide and silicon nitride, like BOE solution or dilute hydrofluoric acid (DHF) solution for example. Accordingly, as the etching process is performed to remove a part of the first material layer 22, the nitride layer 20 can serve as an etching stop layer to protect the corner of the opening 28. In the etching process, the sides of the first material layer 22 may contact the etchant and an additional part of the first material layer 22 may be damaged, accordingly, after the etching process, the width of the first material layer 22 may be substantially smaller than the width of the patterned photoresist layer 30. Therefore, the patterned photoresist layer 30 used for defining the first material layer 22 has the width larger than the predetermined width of the first material layer 22 for compensating the loss of the first material layer 22 and further providing the complete protection of the corner of the opening 28. The remaining first material layer 22 is within the protection region 26, and covers the bottom surface S1 of the opening 28, the lateral surfaces S2 of the opening 28 and a part of the semiconductor substrate 10. Finally, the patterned photoresist layer 30 is removed.

It is appreciated that, the present invention lowers the thickness t1 of the first material layer 22 to avoid a too big difference of stress uniformity between the first material layer 22 on the first side 101 and the first material layer 22 on the second side 102, which may induce stress and defects such as cracks within the semiconductor substrate 10. In addition, the present invention further removes the first material layer 22 on the first side 101 and outside the protection region 26 and the first material layer 22 on the second side 102, but leaves the first material layer 22 in the protection region 26. The occupied region of the first material layer 22 being smaller, it may induce less stress to the semiconductor substrate 10 and keep the integrity of the semiconductor substrate 10. Furthermore, the processing time of the removal of the first material layer 22 could be shortened due to the thinner first material layer 22, and unexpected residues of first material layer 22 could be avoided as well.

Figure 7:
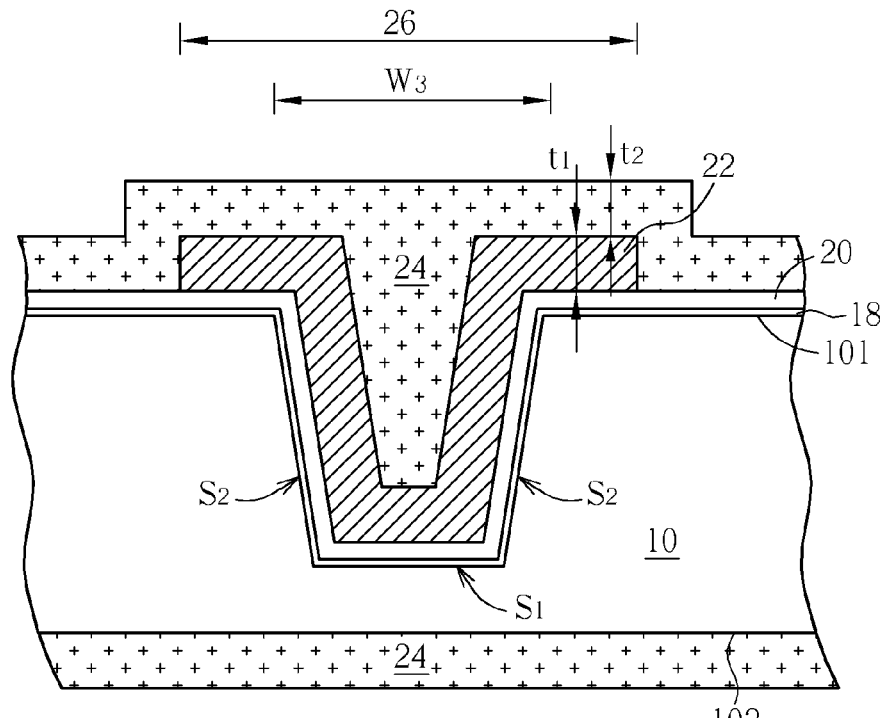

As shown in FIG. 7, the second material layer 24 is deposited all over the first side 101 and the second side 102 of the semiconductor substrate 10. The second material layer 24 may include insulating material such as silicon oxide, or non-doped silicate glass (NSG). The second material layer 24 is preferably made of the same material as the first material layer 22. Therefore, the same process could be implemented for the two material layers to save on production costs. In this exemplary embodiment, the first material layer 22 is accompanied by the second material layer 24, and a sum of the thickness t1 of the first material layer 22 and a thickness t2 of the second material layer 24 is substantially larger than or equal to half of the width w3 of the opening 28; that is, the first material layer 22 and the second material layer 24 may together fill the opening 28. Analogically, in another exemplary embodiment, a thickness t2 of the second material layer 24 could be substantially smaller than or equal to one fourth of the width w3 of the opening 28, and the thickness t2 of the second material layer 24 could be preferably substantially equal to one fourth of the width w3 of the opening 28. Associated with the first material layer 22, a sum of the thickness t1 of the first material layer 22 and the thickness t2 of the second material layer 24 may be substantially larger than or equal to the half of the width w3 of the opening 28.

Figure 8:
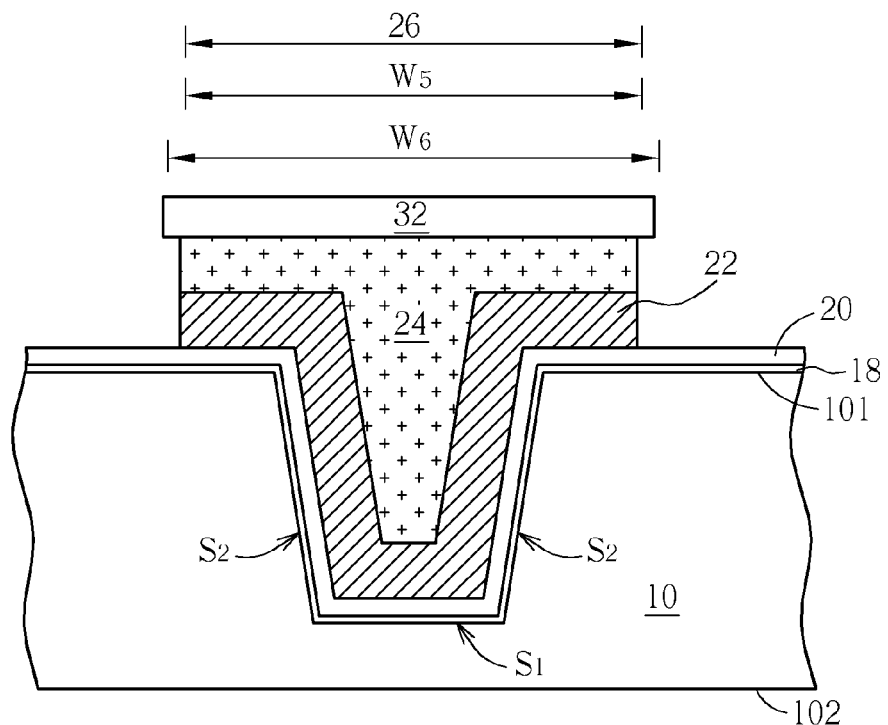

As shown in FIG. 8, a patterned photoresist layer 32 is formed on the second material layer 24. The patterned photoresist layer 32 can cover the top of the opening 28, and a width w6 of the patterned photoresist layer 32 is substantially larger than the width w5 of the protection region 26. To avoid excessive accumulated thickness on the front side and the back side of the semiconductor substrate 10, a part of the second material layer 24 on the first side 101 and outside the protection region 26, and all the second material layer 24 on the second side 102 are removed before the following planarization step. A preferably unique etching process is performed to simultaneously remove a part of the second material layer 24 on the first side 101 and outside the protection region 26 and all of the second material layer 24 on the second side 102. The etching process may be a wet etching process, and the etchant preferably has selectivity properties towards silicon oxide and silicon nitride, BOE solution or dilute hydrofluoric acid (DHF) solution, for example. Accordingly, as the etching process is performed to remove a part of the second material layer 24, and the remaining first material layer 22, the nitride layer 20, can serve as an etching stop layer and could protect the corner of the opening 28 from damages. The remaining second material layer 24 is within the protection region 26, and covers the bottom surface S1 of the opening 28, the lateral surfaces S2 of the opening 28 and a part of the semiconductor substrate 10. The patterned photoresist layer 32 is then removed.

Figure 9:
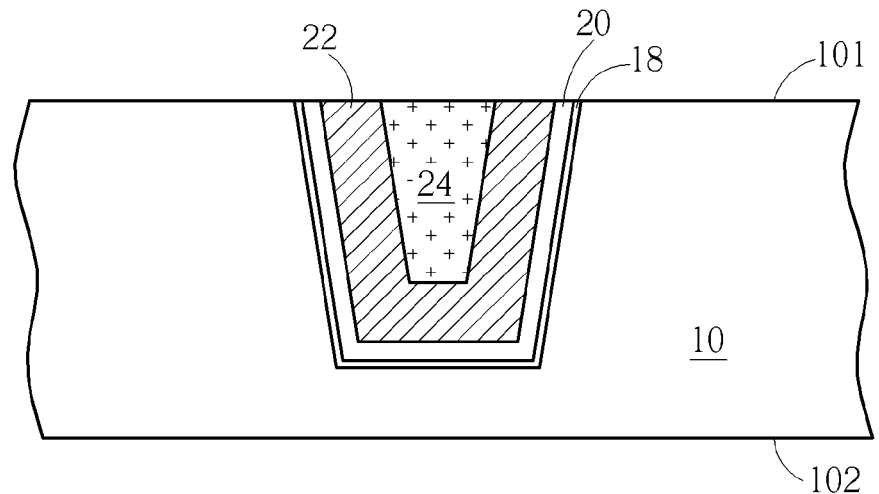
Figure 10:
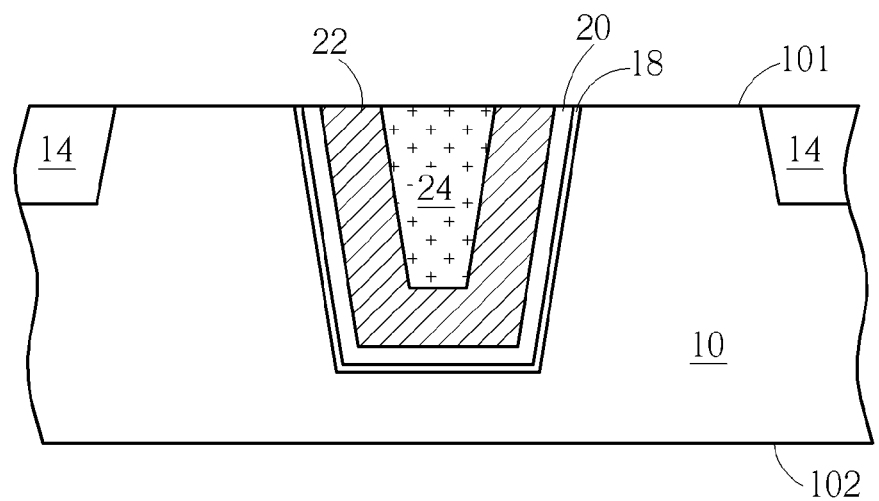

Furthermore, as shown in FIG. 9, the remaining first material layer 22 and the remaining second material layer 24 on the first side 101 are planarized. The planarization process could be a chemical mechanical polish (CMP) process. Additionally, the pad oxide layer 18 and the nitride layer 20 on the first side 101 and outside the protection region 26 are further removed. Accordingly, a structure of the protection ring 12 is completed. Moreover, as shown in FIG. 10, a shallow trench isolation 14 is formed in the semiconductor substrate 10. A depth of the shallow trench isolation 14, such as 2 μm, is substantially smaller than a depth of the opening 28, such as 52 μm. As the shallow trench isolation processes are known to those skilled in the art, the details are omitted herein for brevity. It is appreciated that, the method of fabricating the protection ring can be further integrated into the through silicon via (TSV) processes including via first process and via last process.

In conclusion, the present invention provides a multi-steps process for respectively forming the first material layer and the second material layer to fill the opening, in which a thickness of the first material layer is substantially equal to one fourth of a width of the opening, or a thickness of the second material layer is substantially equal to one fourth of a width of the opening. The present invention reduces the accumulated thickness of the material layer formed in one step, and followed by an etching process to simultaneously remove a part of the material later on the first side outside the protection region and the overall material layer on the second side. Accordingly, the defects within the semiconductor substrate, such as cracks caused by the stress due to the poor uniformity of the thick material layers on the different sides, can be avoided, and the reliability of the semiconductor device performance can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a protection ring disposed in the semiconductor substrate, wherein the protection ring comprises a pad oxide layer, a nitride layer, a first material layer and a second material layer, wherein the pad oxide layer and the nitride layer disposed between the semiconductor substrate and the first material layer surround the first material layer and the second material layer, and a stress of the first material layer applied to the semiconductor substrate and a stress of the second material layer applied to the semiconductor substrate are different; and
   at least a through silicon via (TSV) disposed in the semiconductor substrate, wherein the protection ring surrounds the through silicon via, and the protection ring does not contact the through silicon via.

2. The semiconductor device according to claim 1, wherein a thickness of the first material layer is substantially smaller than or equal to one fourth of a width of the protection ring.

3. The semiconductor device according to claim 1, wherein a thickness of the second material layer is substantially smaller than or equal to one fourth of a width of the protection ring.

4. The semiconductor device according to claim 1, wherein a sum of a thickness of the first material layer and a thickness of the second material layer is substantially larger than or equal to half of a width of the protection ring.

5. The semiconductor device according to claim 1, wherein the first material layer and the second material layer comprise insulating material.

6. The semiconductor device according to claim 5, wherein the insulating material comprises silicon oxide or non-doped silicate glass (NSG).

7. The semiconductor device according to claim 1, further comprising:
   a shallow trench isolation (STI) disposed in the semiconductor substrate, wherein a depth of the shallow trench isolation is substantially smaller than a depth of the protection ring.

8. The semiconductor device according to claim 7, wherein an aspect ratio of the protection ring is substantially larger than an aspect ratio of the shallow trench isolation.

* * * * *